United States Patent [19]

Maeda

[11] Patent Number: 4,926,036
[45] Date of Patent: May 15, 1990

[54] LIGHT DETECTOR

[75] Inventor: Takanori Maeda, Saitama, Japan

[73] Assignee: Pioneer Electronic Corporation, Tokyo, Japan

[21] Appl. No.: 338,074

[22] Filed: Apr. 14, 1989

[30] Foreign Application Priority Data

Sep. 13, 1988 [JP] Japan ................. 63-119266[U]

[51] Int. Cl.$^5$ .............................................. G01J 1/20
[52] U.S. Cl. ................................ 250/201.1; 369/46
[58] Field of Search .................... 250/201; 369/45, 46

[56] References Cited

U.S. PATENT DOCUMENTS

| 4,392,009 | 7/1983 | Napoli . | |
|---|---|---|---|
| 4,525,826 | 6/1985 | Nakamura et al. | 369/46 |
| 4,810,871 | 3/1989 | Opheij | 250/201 |
| 4,843,603 | 6/1989 | Prikryl | 250/201 |

FOREIGN PATENT DOCUMENTS 0228721  7/1987  European Pat. Off. .

Primary Examiner—David C. Nelms
Assistant Examiner—K. Shami
Attorney, Agent, or Firm—Sughrue, Mion, Zinn, Macpeak & Seas

[57] ABSTRACT

A light detector for receiving and detecting a beam of light which includes a plurality of light-detecting areas, and a separating area for separating the light-detecting areas. A portion of the separating area outside an area in which the beam of light is applied has a width which is greater than the width of a portion of the separating area inside the area in which the beam of light is applied, thereby reducing the coupling capacity between light-detecting areas and allowing the light-detecting areas to be increased.

11 Claims, 4 Drawing Sheets

LIGHT DETECTOR

FIELD OF THE INVENTION

The present invention relates to a light detector for photoelectric conversion in an optical disk unit or the like, and particularly relates to the shape of separating areas which separate a light-receiving area of the light detector into a plurality of divisional light-receiving areas.

BACKGROUND OF THE INVENTION

FIG. 6 shows a conventional light detector.

In FIG. 6, reference numerals 1 to 4 represent substantially square divisional light-receiving areas which are separated one from one another by separating areas 5, each having a uniform width.

Reference symbol A represents an actual light-receiving area to which a bundle of luminous flux (light spot) is applied. The area A is circularly shaped so as to equally and partially cover respective divisional light-receiving areas 1 to 4.

FIG. 7 is a circuit diagram for obtaining a tracking error signal from the output of the light detector shown in FIG. 6 by means of a push-pull system.

In FIG. 7, reference numeral 11 represents an adder for adding the respective outputs of divisional light-receiving areas 1 and 2; 12 represents an adder for adding the respective outputs of the divisional light-receiving areas 3 and 4; and 13 represents a subtracter for subtracting the output of adder 12 from the output of adder 11.

Next, the operation will be described.

In an optical disk, a bundle of luminous flux is received by several areas, that is, the four divisional light-receiving or light-detecting areas 1 to 4 in this example, and a signal for controlling the position of the bundle of luminous flux (tracking error signal) is obtained by comparing the strengths or phases of the respective outputs of the respective divisional light-receiving areas 1 to 4.

For example, in the case where a tracking error signal for tracking an information signal track is obtained by a push-pull system, and when the information signal track moves in the direction of arrow X in FIG. 6, that is, in the track-running direction while a disk is rotating, subtracter 13 subtracts the output of adder 12 for adding the respective outputs of divisional light-receiving areas 3 and 4 from the output of adder 11 for adding the respective outputs of divisional light-receiving areas 1 and 2, so that a tracking error signal (a differential signal) TE corresponding to the quantity of displacement in tracking can be obtained as shown in FIG. 8.

Tracking error signal TE is a signal corresponding to the quantity of tracking displacement in the direction of arrow Y in FIG. 6.

Accordingly, it is possible to perform proper tracking control by correcting the quantity of tracking displacement on the basis of the tracking error signal produced from subtracter 13.

In order to facilitate the adjustment of the light detector and to prevent the sensitivity of the light detector from being lowered even if the bundle of luminous flux is displaced on the light detector, as described above, the size of the light-receiving area (the sum of divisional light-receiving areas 1 to 4) required for performing proper tracking control is established so as to be larger than the size of the actual light-receiving area A to which a bundle of luminous flux is applied stationarily.

In such a light detector, if separating areas 5 are made wider, the area in which received light cannot be detected becomes larger so that it becomes impossible to perform accurate detection and communication of information. It is therefore necessary to make the separating areas 5 as narrow as possible.

Since a conventional light detector is so configured as described above, if separating areas 5 are made narrow, signals interfere with each other because of coupling between adjacent ones of the divisional light-receiving areas 1 to 4, thereby producing so-called crosstalk which influences the accuracy of the light detector, particularly in the case of a signal of a high frequency.

In such a heterodyne system or the like, therefore, there has been a problem in that when a tracking control signal or the like is obtained through phase-comparison of the respective outputs of the respective divisional light-receiving areas 1 to 4 in a high band, it is necessary to selectively determine whether the width of separating areas 5 is to be made wider in order to prevent crosstalk at the sacrifice of accurate detection and communication of information, whether the width of separating areas 5 is to be made narrow at the sacrifice of frequency characteristic, or whether the light-receiving area of the light detector is to be made smaller at the sacrifice of ease of initial adjustment.

That is, generally, a light detector is moved in order to adjust and put the light detector in a predetermined position, and the position in which the light detector is put in the beginning of the adjustment is generally selected in a broad range which is a 100 times as wide as the actual light-receiving area A. In actual adjustment, a user determines the position while monitoring the output of the light detector. Since a light detector is small in size and the light-receiving area thereof is narrow, the work necessary to search a bundle of luminous flux (a light spot) on the light detector has been very troublesome.

The reason why the position in which the light detector is to be put in the beginning of adjustment is so wide is that the position of the light detector is displaced when it is housed in a package, or the adjustment-initiating position of a position-adjustment mechanism is quite uncertain.

Taking the labor of adjustment into consideration, therefore, it is easy to adjust the light detector if a light detector is provided at the initial position so that the quantity and direction of displacement of the light detector can be determined; but if there is no light detector in the initial position, it is impossible to determine the direction in which the position of the light detector is to be moved, so that much time and labor are required for the search of the position to which a bundle of luminous flux is applied, and it is difficult therefore to automatically adjust the position of the light detector.

However, if the light-receiving area of the light detector is enlarged, the coupling capacity between adjacent ones of the divisional light-receiving areas 1–4 becomes large. For example, in a case, as has been known as a heterodyne system or a time difference system, in which a tracking error signal or the like is obtained on the basis of the quantity of phase shift between the respective high frequency signals of adjacent ones of the divisional light-receiving areas 1 to 4; that is, in a case in which a phase difference signal is required over a high frequency band, it becomes impossible to obtain this phase difference signal if crosstalk is produced in the high frequency band by the coupling capacity.

As shown in FIG. 9, therefore, the phase difference transfer characteristic of the light detector illustrated by curve II is deteriorated to a greater extent than the frequency of the phase difference signal illustrated by curve I, and there has been a problem in that it is difficult to obtain a light detector which is easily adjusted and which has little crosstalk, in the recent circumstances where an optical disk unit of high density and broad band is required.

Curve III in FIG. 9 shows the transfer characteristic of a phase difference signal in the case in which the separating areas 5 are made narrow.

According to the heterodyne system, a tracking control signal is obtained through a circuit shown in FIG. 10 on the basis of the respective outputs of divisional light-receiving areas 1 to 4 of the light detector shown in FIG. 6.

In FIG. 10, reference numeral 21 represents an adder for adding the respective outputs of divisional light-receiving areas 1 and 3; 22 represents an adder for adding the respective outputs of divisional light-receiving areas 2 and 4; 23 represents an adder for adding the respective outputs of adders 21 and 22; 24 represents a subtracter for subtracting the output of adder 22 from the output of adder 21; 25 represents a rising pulse-generating circuit (RPG) for supplying a sampling pulse on the basis of the output of adder 23; 26 represents a falling pulse-generating circuit (FPG) for supplying a sampling pulse on the basis of the output of adder 23; 27 and 28, respectively, represent gates for passing the output of subtracter 24 on the basis of the respective outputs of RPG 25 and FPG 26; 29 and 30, respectively, represent holding circuits for holding the outputs of gates 27 and 28; and 31 represents a subtracter for subtracting the output of holding circuit 30 from the output of holding circuit 29, the output of subtracter 31 being used as the tracking error signal TE.

SUMMARY OF THE INVENTION

The present invention has been attained in order to solve the foregoing problems, and an object thereof is to provide a light detector which can be easily adjusted and which has little crosstalk.

In the light detector according to the present invention, the width of at least one separating area is made wider at a portion positioned outside an actual light-receiving area than at the remainder portion positioned inside the actual light-receiving area.

In the light detector according to the present invention, since the width of at least one separating area is made wider at a portion positioned outside the actual light-receiving area than at the remainder portion positioned inside the actual light-receiving area, the coupling capacity between divisional light-receiving areas becomes small so that the frequency characteristics of the light detector is improved.

PREFERRED EMBODIMENTS OF THE INVENTION

The following preferred embodiments of the present invention will now be described with reference to the drawings.

Figure 1:
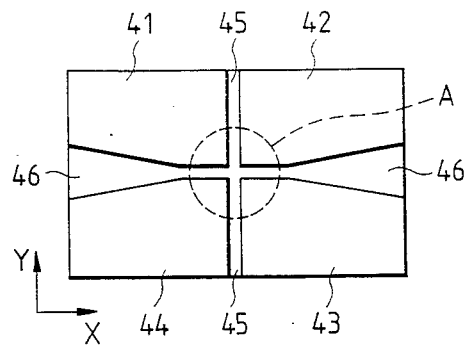
FIG. 1 is a plan view illustrating a light-receiving area of a light detector according to an embodiment of the present invention.

FIG. 1 is a plan view illustrating a light-receiving area of a light detector according to an embodiment of the present invention.

In FIG. 1, reference numerals 41 to 44 represent rectangular divisional light-receiving areas which are separated by separating areas 45 and 46.

Reference symbol A represents an actual light-receiving area A to which a bundle of luminous flux is applied and which is circularly shaped so as to equally and partially cover the respective divisional light-receiving areas 41 to 44.

The width of each of the separating areas 45 which separate divisional light-receiving areas 41 and 42 from each other and divisional light-receiving areas 43 and 44 from each other respectively is made uniform. However, the width of each of separating area 46 which separates divisional light-receiving areas 42 and 43 from each other and divisional light-receiving areas 41 and 44 from each other respectively is made uniform at the inside of the actual light-receiving area A while made non-uniform so as to increase, at the outside of the actual light-receiving area A, in a direction going away from the actual light-receiving area A.

Next, the operation will be described.

When a bundle of luminous flux is applied to the actual light-receiving area A, it is possible to achieve accurate detection and transfer of signals because the separating areas 45 and 46 are narrow inside the actual light-receiving area similar to that of the conventional case.

Further, since divisional areas 41 and 44 are separated from each other and divisional light-receiving areas 42 and 43 are separated from each other by the respective separating areas 46, the coupling capacity between light-receiving areas is small so that it is possible to make the respective divisional light-receiving areas 41 to 44 larger in the direction of arrow X than those in the conventional case.

Figure 2:
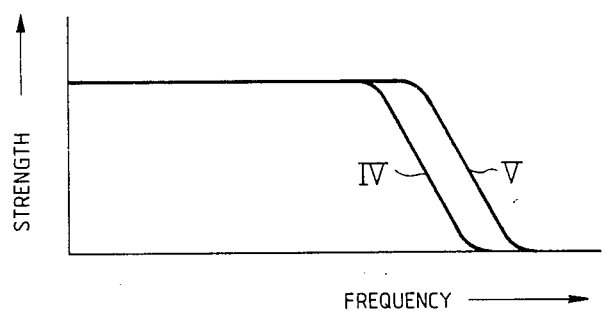
FIG. 2 is a characteristic diagram illustrating a phase difference transfer characteristic of the light detector according to the present invention.
Figure 10:
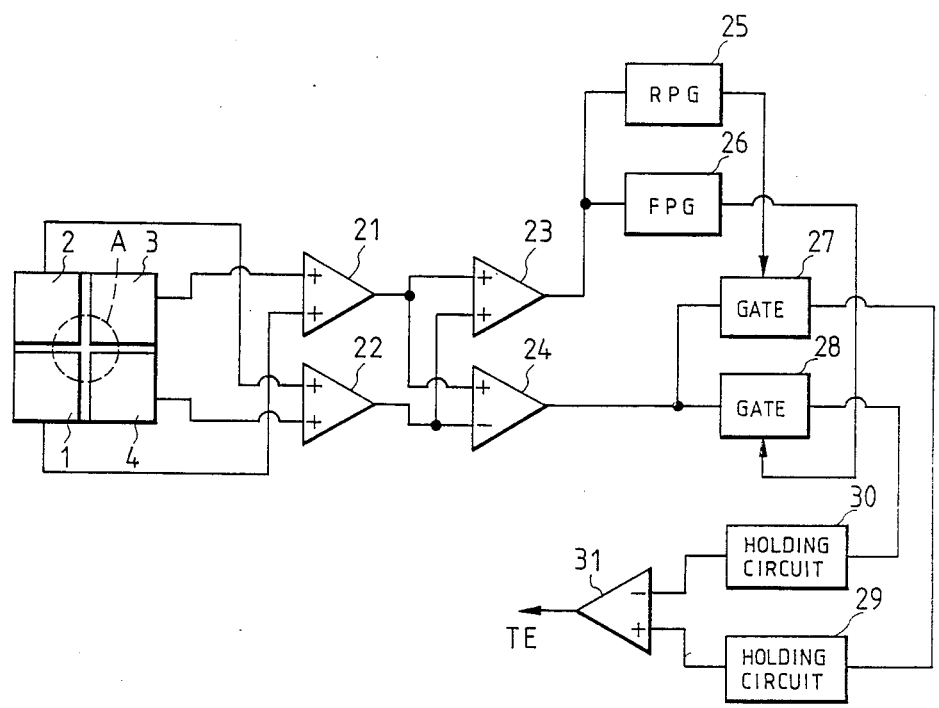
FIG. 10 is a diagram of a circuit for obtaining a tracking error signal by a heterodyne system.

The influence of crosstalk is therefore reduced, and the phase difference transfer characteristic of the light detector illustrated by curve V (FIG. 2) is improved relative to the phase difference signal frequency illustrated by the curve IV (being the same characteristic as curve I in FIG. 10).

Since a light-receiving area of the light detector is made wide, it is easy to obtain the position of a bundle of luminous flux, and therefore it is possible to easily perform the adjustment of the light detector.

Although the case in which the width of separating areas 46 in the direction of arrow X is widened outside the actual light-receiving area A has been described, separating areas 45 in the direction of arrow Y may be arranged in the same manner as in the above case so that it is possible to make the respective divisional light-receiving areas 41 to 44 larger in the direction of arrow Y than those in the conventional case.

Figure 3:
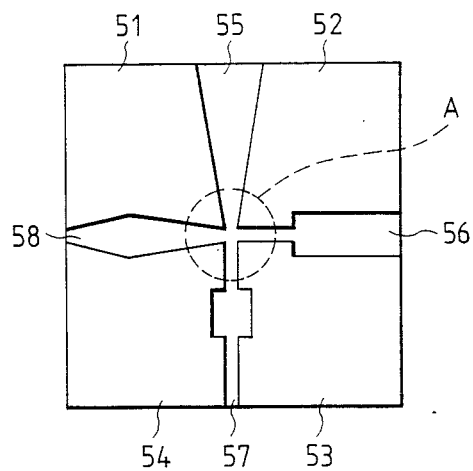
FIGS. 3, 4 and 5 are plan views respectively illustrating a light-receiving area of the light detector according to other embodiments of the present invention.

FIG. 3 is a plan view illustrating a light-receiving area in another embodiment of the present invention, in which parts which are the same as those in FIG. 1 are referenced correspondingly.

In FIG. 3, reference numerals 51 to 54 represent divisional light-receiving areas which are separated from one another by separating areas 55 to 58.

The width of separating area 55 which separates divisional light-receiving areas 51 and 52 from each other is made to extend gradually increase from the inside of the actual light-receiving area A to the outside of the actual light-receiving area A; the width of separating area 56 which separates divisional light-receiving areas 52 and 53 from each other is made uniform from the inside of the actual light-receiving area A to a portion at the outside of actual light-receiving area A while made uniform but wider than the width inside the actual light-receiving area A at the remainder portion outside the actual light-receiving area A, the width of separating area 57 which separates divisional light-receiving areas 53 and 54 from each other is made uniform from the inside of actual light-receiving area A to the outside of the actual light-receiving area A while made uniform but wider in a portion outside the actual light-receiving area A than the width inside actual light-receiving area A, and the width of separating area 58 which separates divisional light-receiving areas 54 and 51 from each other gradually increased at a portion from the inside of actual light-receiving area A and then gradually narrowed at the remainder portion following the former portion.

Figure 4:
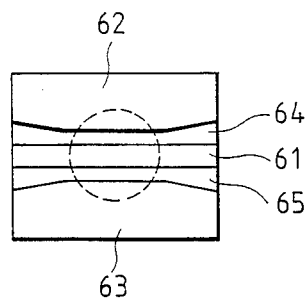

FIG. 4 is a plan view illustrating a light-receiving area in another embodiment of the present invention, in which parts which are the same as those in FIG. 1 are referenced correspondingly.

In FIG. 4, reference numerals 61 to 63 represent divisional light-receiving areas which are separated by separating areas 54 and 65.

The width of light-receiving area 61 is made uniform, and the width of each of the separating areas 64 and 65 which respectively separate divisional light-receiving areas 61 and 62 from each other and divisional light-receiving areas 61 and 63 from each other is made uniform from the inside of actual light-receiving area A to a portion outside the actual light-receiving area A while made to gradually increase in a direction going away from the actual light-receiving area A. In the case in which a push-pull system is used, a tracking error signal is obtained from the difference between the respective outputs of divisional light-receiving areas 62 and 63, and a focus error signal is obtained from the difference between the output of light-receiving area 61 and the sum of the respective outputs of light-receiving areas 62 and 63.

Figure 5:
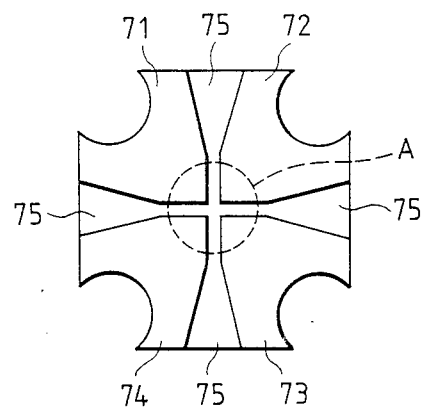
Figure 6:
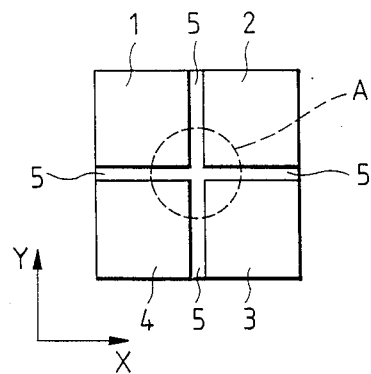
FIG. 6 is a plan view illustrating a light-receiving area of a conventional light detector.
Figure 7:
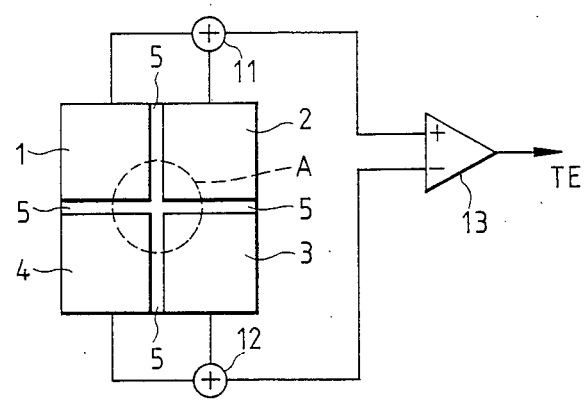
FIG. 7 is a diagram of a circuit for obtaining a tracking error signal from the outputs of divisional light-receiving areas by a push-pull system.
Figure 8:
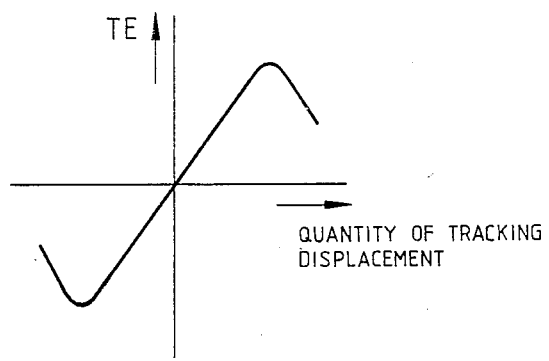
FIG. 8 is a characteristic diagram illustrating a tracking error signal relative to the quantity of tracking displacement.
Figure 9:
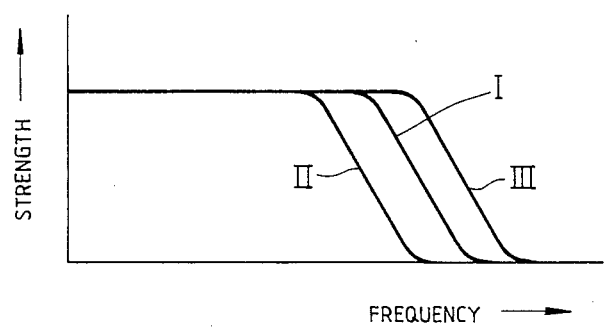
FIG. 9 is a characteristic diagram illustrating a phase difference transfer characteristic of the conventional light detector.

FIG. 5 is a plan view illustrating a light-receiving area in another embodiment of the present invention.

In FIG. 5, reference numerals 71 to 74 represent divisional light-receiving areas having constrictions toward the center at their outer corners, divisional light-receiving areas 71 to 74 being separated from one another by separating areas 75.

The width of each light-receiving area 75 is made uniform inside the actual light-receiving area A while made to gradually increase outside the actual light-receiving area A in a direction going away from the actual light-receiving area A.

In each of the above-mentioned embodiments in FIGS. 3 to 5, it is possible to obtain the same effect as that in the embodiment of FIG. 1.

Although the cases in which three or four divisional light-receiving areas have been described by way of examples in the above-mentioned embodiments, it is possible to obtain the same effect even if the number of divisional light-receiving areas is made two.

Moreover, although the cases in which divisional light-receiving areas were shaped so as to be substantially square or rectangular, it is possible to obtain the same effect even if the shape of each of the divisional light-receiving areas is made circular or the like.

Further, although the case of a tracking error signal (tracking control signal) has been described, the present invention is also applicable to the case of a focus servo signal or the like.

As has been described above, according to the present invention, since the width of a separating area is made wider at a portion positioned outside an actual light-receiving area than at the remainder portion positioned inside the actual light-receiving area, the coupling capacity between the divisional light-receiving areas is small, so that it is possible to enlarge the light-receiving area.

The present invention therefore allows a light detector to be easily adjusted. Further, crosstalk is reduced so that it is possible to perform accurate detection and transfer of information.

What we claim is:

1. A light detector for receiving and detecting a beam of light, comprising:
    at least two light-detecting areas; and
    at least one separating area for separating said at least two light-detecting areas;
    a portion of said at least two light-detecting areas and a portion of said at least one separating area which actually receives the beam of light being termed the actual light-receiving area;
    a shape of said at least one separating area being such that a width of at least a portion of said at least one separating area which is outside of the actual light-receiving area is greater than the greatest width of said at least one separating area which is inside of the actual light-receiving area.

2. The light detector of claim 1, wherein the light detector comprises first, second and third light-detecting areas and first and second separating areas, said first separating area separating said first and second light-detecting areas, and said second separating area separating said second and third light-detecting areas.

3. The light detector of claim 2, wherein each of said first and second separating areas has a uniform width inside of the actual light-receiving area.

4. The light detector of claim 3, wherein each of said first and second separating areas has a non-uniform width outside of the actual light receiving area.

5. The light detector of claim 4, wherein the non-uniform width of said first and second separating areas gradually increases in a direction away from the actual light-receiving area.

6. A light detector for receiving and detecting a beam of light, comprising:
   first, second, third and fourth light-detecting areas; and
   first, second, third and fourth separating areas, said first separating area separating said first and second light-receiving areas, said second separating area separating said second and third light-receiving areas, said third separating area separating said third and fourth light-receiving areas, and said fourth separating area separating said fourth and first light-detecting areas;
   a portion of said light-detecting areas and a portion of said separating areas which actually receive the beam of light being termed the actual light-receiving area;
   said first and third separating areas having a uniform width inside and out of the actual light-receiving area, said second and fourth separating areas having uniform width inside of the actual light-receiving areas, and a non-uniform width outside of the actual light-receiving area, the width of said second and fourth separating areas outside of the actual light-receiving area gradually increasing in a direction away from the actual light-receiving area.

7. The light detector of claim 6, wherein said light-detecting areas and said separating areas substantially define a rectangle.

8. A light detector for receiving and detecting a beam of light, comprising:
   first, second, third and fourth light-detecting areas; and
   first, second, third and fourth separating areas, said first separating area separating said first and second light-receiving areas, said second separating area separating said second and third light-receiving areas, said third separating area separating said third and fourth light-receiving areas, and said fourth separating area separating said fourth and first light-detecting areas;
   a portion of said light-detecting areas and a portion of said separating areas which actually receive the beam of light being termed the actual light-receiving area;
   each of said separating areas having a shape such that a width of at least a portion thereof which is contained outside of the actual light-receiving area is greater than the greatest width of a portion thereof which is inside of the actual light-receiving area.

9. The light detector of claim 8, wherein said first separating area has a non-uniform width which gradually increases from a center point within the actual light-receiving area, said second separating area has a first uniform width inside of the actual light-receiving area and a second uniform width which is greater than the first uniform width and which is outside of the actual light-receiving area, said third separating area having a first portion located inside of the actual light-receiving area, and second and third portions located outside of the actual light-receiving area, said first, second and third portions of said third separating area each being of uniform width, said first and third portions having widths equal to each other, and said second portion having a uniform width which is greater than the width of said first and third portions, said fourth separating area having first, second and third non-uniform width portions, said first non-uniform width portion being located in the actual light-receiving area and having a non-uniform width which gradually increases from the center point of the actual light-receiving area, said second and third non-uniform width portions both being located outside of the actual light-receiving area, said second non-uniform width portion having a width which gradually increases in a direction away from the light-receiving area, and said third non-uniform width portion having a width which gradually decreases in a direction away from the light-receiving area.

10. The detector of claim 9, wherein said light-receiving areas and said separating areas substantially define a rectangle.

11. The detector of claim 8, wherein each of said separating areas has a first portion located inside the actual light-receiving area and a second portion located outside of the actual light-receiving area, the first portions of each of said separating areas having a uniform width, the second portions of each of the separating areas having a non-uniform width which gradually increases from the uniform width of said first portions in a direction away from the actual light-receiving area.

* * * * *